(12) United States Patent
Sung et al.

(10) Patent No.: US 12,740,399 B2
(45) Date of Patent: Sep. 15, 2026

(54) POWER RAIL LEAD FOR SEMICONDUCTOR STRUCTURES

(71) Applicant: INTERNATIONAL BUSINESS MACHINES CORPORATION, Armonk, NY (US)

(72) Inventors: Min Gyu Sung, Latham, NY (US); Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 364 days.

(21) Appl. No.: 18/396,901

(22) Filed: Dec. 27, 2023

(65) Prior Publication Data

US 2025/0218941 A1 Jul. 3, 2025

(51) Int. Cl.

| | |
|---|---|
| ***H10W 20/41*** | (2026.01) |
| ***H10D 62/13*** | (2025.01) |
| ***H10W 72/00*** | (2026.01) |

(52) U.S. Cl.

CPC ........ *H10W 20/435* (2026.01); *H10D 62/151* (2025.01); *H10W 72/00* (2026.01)

(58) Field of Classification Search

CPC . H10W 20/435; H10W 20/20; H10W 20/427; H10D 62/151

See application file for complete search history.

(56) References Cited

U.S. PATENT DOCUMENTS

| | | | | |
|---|---|---|---|---|
| 10,529,830 | B2 | 1/2020 | Tapily | |
| 10,832,907 | B2 | 11/2020 | Cheng | |
| 11,532,627 | B2 | 12/2022 | Liao | |
| 11,588,050 | B2 | 2/2023 | Yu | |
| 11,764,129 | B2 | 9/2023 | Kao | |
| 2019/0267464 | A1 | 8/2019 | Leobandung | |
| 2020/0020584 | A1 * | 1/2020 | Lin | H10D 30/024 |

(Continued)

FOREIGN PATENT DOCUMENTS

| | | | | |
|---|---|---|---|---|
| CN | 116938220 A | * 10/2023 | | H03K 19/0008 |

OTHER PUBLICATIONS

Sung, et al., "Power Rail Lead for Semiconductor Structures," U.S. Appl. No. 18/396,913, filed Dec. 27, 2023.

(Continued)

*Primary Examiner* — Ida M Soward

(74) *Attorney, Agent, or Firm* — David K. Mattheis

(57) ABSTRACT

A semiconductor structure extends laterally with a first interconnect on one side and a second interconnect on an opposing side separated from the first interconnect by a longitudinal thickness of an insulating member that extends laterally along the first interconnect and the second interconnect. The semiconductor structure includes a first source/drain (S/D) positioned in the insulating member between the first interconnect and the second interconnect, a second S/D positioned in the insulating member adjacent to the first S/D, and a first lead electrically connected to the first S/D and to the second interconnect and electrically insulated from the second S/D. A first lateral end of the first lead is angled inwards towards the first S/D at a first acute angle, and a second lateral end of the first lead is angled away from the first S/D at a second acute angle.

19 Claims, 13 Drawing Sheets

(56) References Cited

U.S. PATENT DOCUMENTS

2021/0111115 A1 4/2021 Morrow
2021/0134721 A1 5/2021 Chiang
2021/0202385 A1 7/2021 Huang
2021/0305252 A1 9/2021 Chiang
2021/0305262 A1 9/2021 Wang et al.
2021/0305381 A1 9/2021 Chiang
2021/0351303 A1 11/2021 Ju
2021/0376071 A1 12/2021 Liu
2021/0376093 A1 12/2021 Chu
2021/0391318 A1* 12/2021 Peng ...................... H10D 89/10
2021/0399099 A1 12/2021 Chu
2022/0139911 A1 5/2022 Wei
2022/0310514 A1* 9/2022 Wei .................... H10D 84/0151
2022/0352326 A1* 11/2022 Huang ................... B82Y 10/00
2022/0359676 A1 11/2022 Chu
2023/0040094 A1 2/2023 Huang et al.
2023/0068359 A1* 3/2023 Chang .................. H10D 84/853
2023/0093101 A1 3/2023 Xie
2023/0139929 A1* 5/2023 Xie ..................... H10W 20/427 257/288
2023/0187441 A1 6/2023 Guler
2023/0187551 A1 6/2023 Cheng
2023/0215767 A1* 7/2023 Xie ...................... H10D 64/017 257/329
2023/0282722 A1* 9/2023 Frougier ............ H10D 30/6735 257/288
2023/0298996 A1* 9/2023 Abu-Rahma ....... H10W 20/427 257/369
2023/0317596 A1* 10/2023 Kim ...................... H10W 20/42 257/401
2024/0169137 A1* 5/2024 You ....................... G06F 30/398

OTHER PUBLICATIONS

List of IBM Patents or Patent Applications Treated as Related, Dec. 27, 2023, 2 pgs.

* cited by examiner (Operation 202)

(Operation 204)

(Operation 208)

(Operation 212)

(Operation 214)

(Operation 216)

(Operation 218)

(Operation 220)

(Operation 222)

POWER RAIL LEAD FOR SEMICONDUCTOR STRUCTURES

BACKGROUND

The present disclosure relates to semiconductor devices, and more specifically, to interconnects between layers in an integrated circuit.

Field-effect transistors ("FETs") use an electric field effect to control current flow within a semiconductor device. Specifically, FETs may use the electric charge of their gates to affect and control the current flow through a channel. In some integrated circuits, there is a power rail that FETs can be connected to using interconnects. To prevent electrical short circuits between these interconnects, the interconnects are spaced apart from each other. However, adding space between FETs decreases the computing power density of the integrated circuit. Furthermore, reducing the size of the interconnects to increase computing power density can reduce the contact area between the power rail and the FETs. Depending on how the manufacturing tolerances of the integrated circuit stack up, some FETs end up with insufficient power connections.

SUMMARY

In one embodiment of the present disclosure, a semiconductor structure extends laterally with a first interconnect on one side and a second interconnect on an opposing side separated from the first interconnect by a longitudinal thickness of an insulating member that extends laterally along the first interconnect and the second interconnect. The semiconductor structure includes a first source/drain (S/D) positioned in the insulating member between the first interconnect and the second interconnect, a second S/D positioned in the insulating member adjacent to the first S/D, and a first lead electrically connected to the first S/D and to the second interconnect and electrically insulated from the second S/D. A first lateral end of the first lead is angled inwards towards the first S/D at a first acute angle, and a second lateral end of the first lead is angled away from the first S/D at a second acute angle.

In another embodiment of the present disclosure, a semiconductor structure extends laterally with a first interconnect on one side and a second interconnect on an opposing side separated from the first interconnect by a longitudinal thickness of an insulating member that extends laterally along the first interconnect and the second interconnect. The semiconductor structure includes a first S/D positioned in the insulating member between the first interconnect and the second interconnect, and the insulating member comprises a plurality of insulators. The semiconductor structure also includes a second S/D positioned in the insulating member adjacent to the first S/D, a third S/D positioned in the insulating member adjacent to the second S/D on the opposite side from the first S/D, a first lead electrically connected to the first S/D and to the second interconnect and electrically insulated from the second S/D, a second lead electrically connected to the first S/D and to the second interconnect and electrically insulated from the second S/D, and an insulator of the plurality of insulators positioned between the first lead and the second lead to electrically insulate the first lead from the second lead.

DETAILED DESCRIPTION

Figure 1:
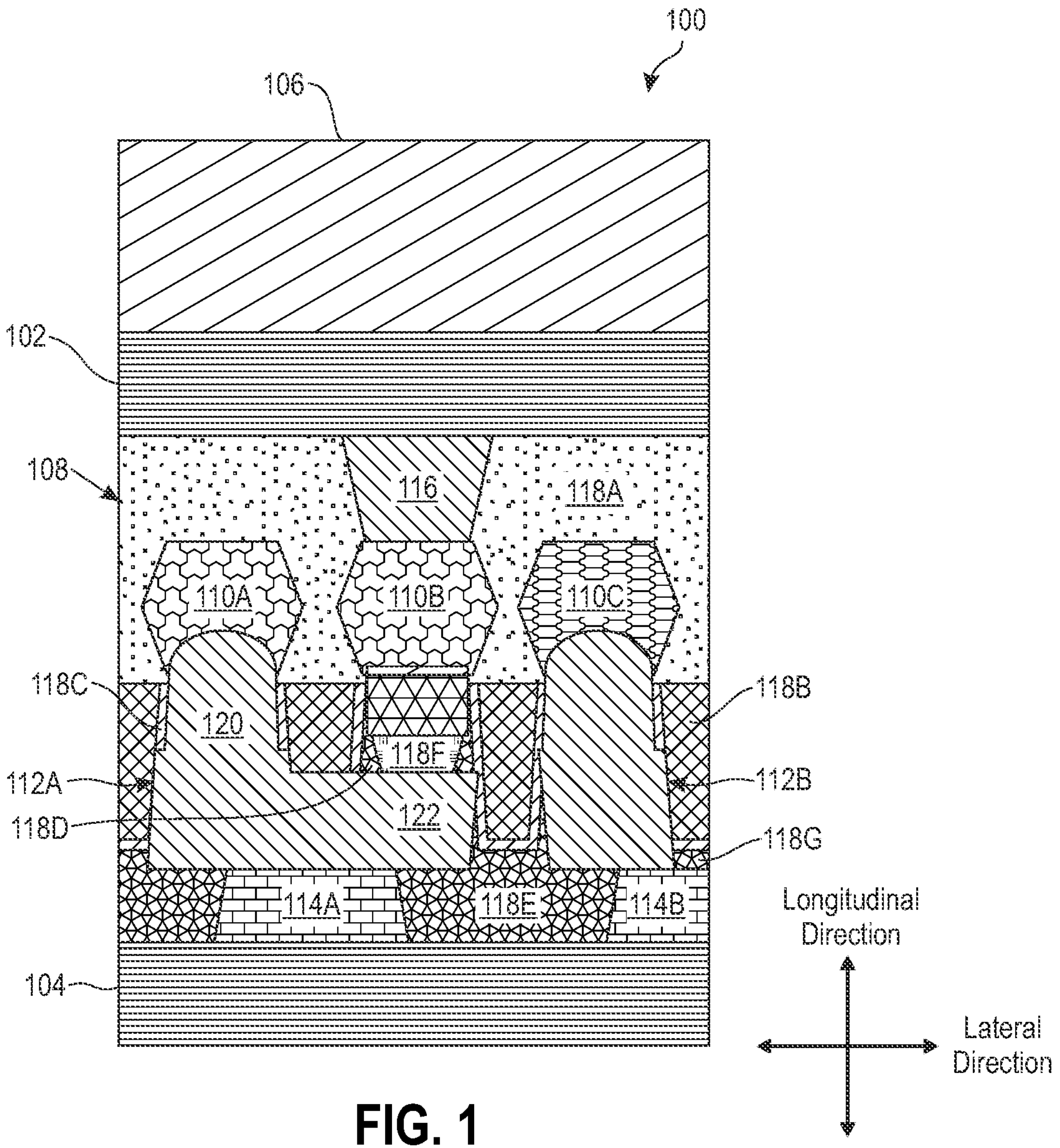
FIG. 1 is a cross-section view of a semiconductor structure, in accordance with embodiments of the present disclosure.

FIG. 1 is a cross-section view of semiconductor structure 100 that extends laterally (i.e., left-and-right as depicted in FIG. 1) with top interconnect 102 on one side (a.k.a., the back-end-of-line (BEOL) of semiconductor structure 100) and bottom interconnect 104 (a.k.a., the backside power distribution network of semiconductor structure 100) on an opposing side. Top interconnect 102 is mounted to carrier wafer 106, and top interconnect 102 and bottom interconnect 104 are separated from each other by a longitudinal thickness (i.e., top-to-bottom in FIG. 1) of insulating member 108 that extends laterally along top interconnect 102 and bottom interconnect 104.

In the illustrated embodiment, the space between top interconnect 102 and bottom interconnect 104 can be considered the device region because many electronic components reside in insulating member 108. For example, source/drain epitaxials ("S/Ds") 110A-110C (collectively "S/Ds 110"), leads 112A-112B (collectively "leads 112"), rails 114A-114B (collectively, "rails 114"), and via 116 are selectively electrically connected together within insulating member 108 and are selectively electrically insulated from one another by insulating member 108 depending on the design of semiconductor structure 100. Insulating member 108 can be comprised of different electrically insulating structures, such as, for example, insulators 118A-118G (collectively "insulators 118"), which can be formed at various times during the manufacture of semiconductor structure 100. Each insulator 118 of insulating member 108 can be comprised of a medium dielectric constant material (a.k.a. mid-K), such as, for example, silicon nitride (SiN), silicon dioxide ($SiO_2$), silicon nitride carbide (SiNC), tetraethyl orthosilicate (TEOS), silicon oxycarbide (SiCOx), silicon oxycarbonitride (SiCNO), or siliconboron carbonitride (SiBCN), or a mixture of one or more of the aforementioned materials. Insulators 118 can be comprised of the same material or different materials, and a material can appear in multiple insulators 118. While one embodiment of insulating member 108 is shown in FIG. 1A, other configurations and combinations of insulators are possible.

In the illustrated embodiment, S/Ds 110 are selectively electrically connected to form FETs (not shown in their entireties) and can be n-type or p-type S/Ds. For example, S/Ds 110B-110C can be n-type, and S/D 110A can be p-type. For semiconductor structure 100 to function as intended, electrical connections are made within insulating member 108. These connections can be further connected to top interconnect 102 and/or bottom interconnect 104. For example, the top side of S/D 110B and the bottom side of via 116 are in direct contact with each other, and the top sides of rails 114A-114B are in direct contact with and electrically connected to leads 112A-112B, respectively. Lead 112A has an L-shape (either standard, as depicted, or reversed, in other embodiments), so lead 112A is comprised of two regions-contact 120 and extension 122. More specifically, contact 120 extends longitudinally from S/D 110A, and extension 122 extends laterally across rail 114A. On the other hand, lead 112B is a longitudinal contact without any lateral extension. In some embodiments, the widths of lead 112B and contact 120 are the same or smaller than the widths of S/Ds 110, and extension 122 covers the entire top surface of rails 114 so the contact area between rail 114A and lead 112A is larger than the contact area between lead 112A and S/D 110A. In some embodiments, lead 112B has an L-shape and includes an extension that would extend laterally towards extension 122.

In the illustrated embodiment, a portion of extension 122 is positioned between rail 114A and S/D 110B, which is the laterally adjacent S/D 110 from the S/D 110 that the lead 112 is connected to. Moreover, extension 122 laterally laps S/D 110B, meaning that a portion of extension 122 is directly underneath a portion of S/D 110B because that portion of extension 122 has the same lateral position as that portion of S/D 110B, albeit with a different longitudinal position. However, because insulating member 108 (specifically insulators 118D and 118F) is positioned between S/D 110B and lead 112A, lead 112A is electrically insulated from S/D 110B.

In the illustrated embodiment, rails 114 are in direct contact with and electrically connected to bottom interconnect 104. S/D 110B is not electrically connected on the bottom to rails 114, so instead, S/D 110B is in direct contact with and electrically connected to via 116 on the top. Via 116 can be considered as a middle-of-line (MOL) component and is in direct contact with and electrically connected to top interconnect 102. The signal transmission components (e.g., leads 112 and via 116) are comprised of an electrically conductive material, such as metal (e.g., titanium nitride (TiN), cobalt (Co), ruthenium (Ru), molybdenum (Mo), or tungsten (W)). The signal transmission components can be comprised of the same material or different materials, and a material can appear in multiple components.

The components and configuration of semiconductor structure 100 allow for electrical power to be provided to selected S/Ds 110 (e.g., S/Ds 110A and 110C) by bottom interconnect 104 though rails 114. Because the other S/Ds 110 (e.g., S/D 110B) are connected to top interconnect 102 through vias 116, the areas directly underneath these S/Ds 110 and above bottom interconnect 104 only include insulating member 108. Thereby, a lead 112 (e.g., lead 112A) can be advantageously positioned in these areas lest they remain unutilized. Allowing extension 122 to traverse such an area can allows rails 114 to be laterally narrower, which can increase the lateral distance between adjacent rails 114. In some embodiments, the increase in distance between rails 114 can be larger than the fin or nanosheet pitch. This can prevent electrical shorts from occurring between adjacent rails 114. Furthermore, extension 122 can allow for greater contact between leads 112 (e.g., lead 112A) and rails 114 (e.g., rail 114A) since the entire tops of rails 114 are available for contact, as opposed to only the areas that are lapped by contact 120 or the narrower leads 112 (e.g., lead 112B).

Figure 2:
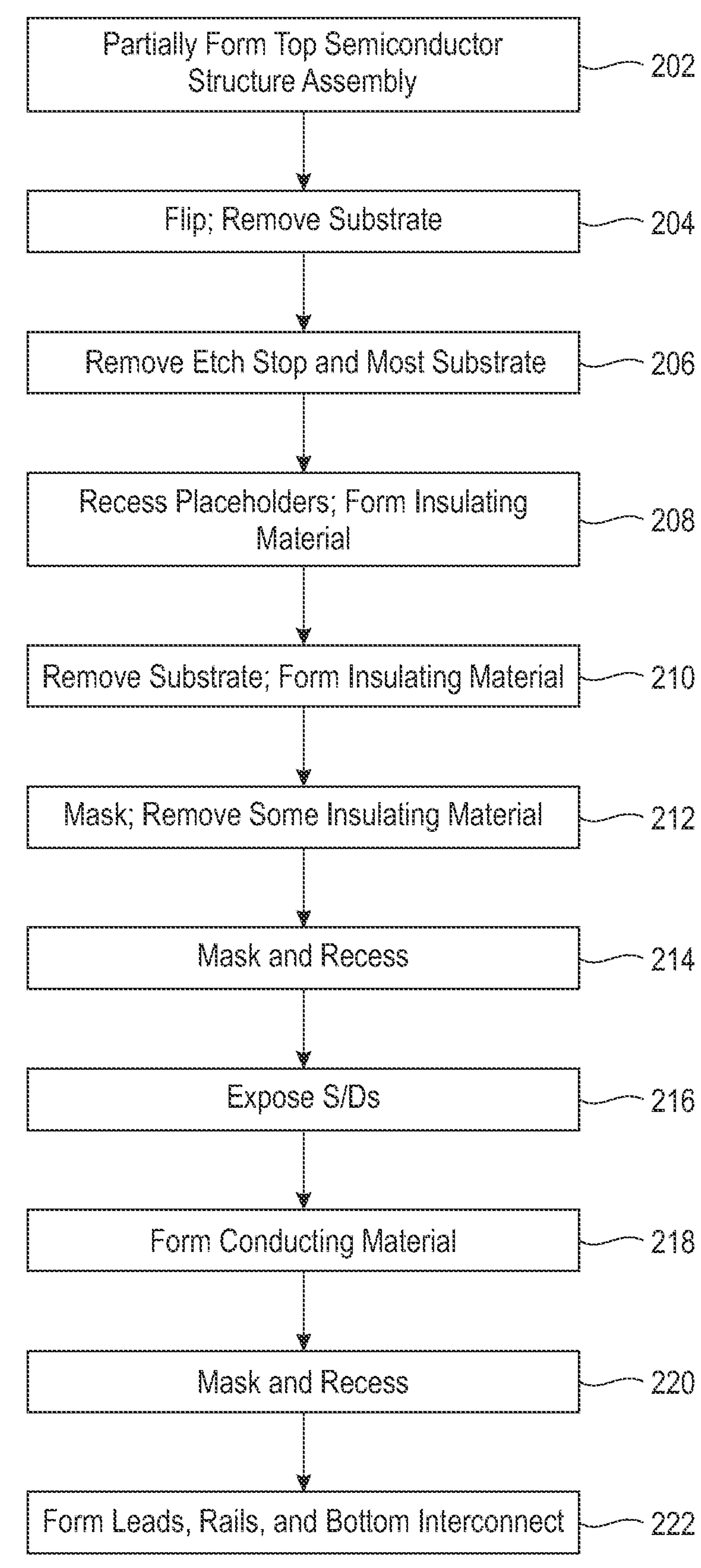
FIG. 2 is a flowchart of a method of manufacturing the semiconductor structure of FIG. 1, in accordance with an embodiment of the present disclosure.
Figure 3A:
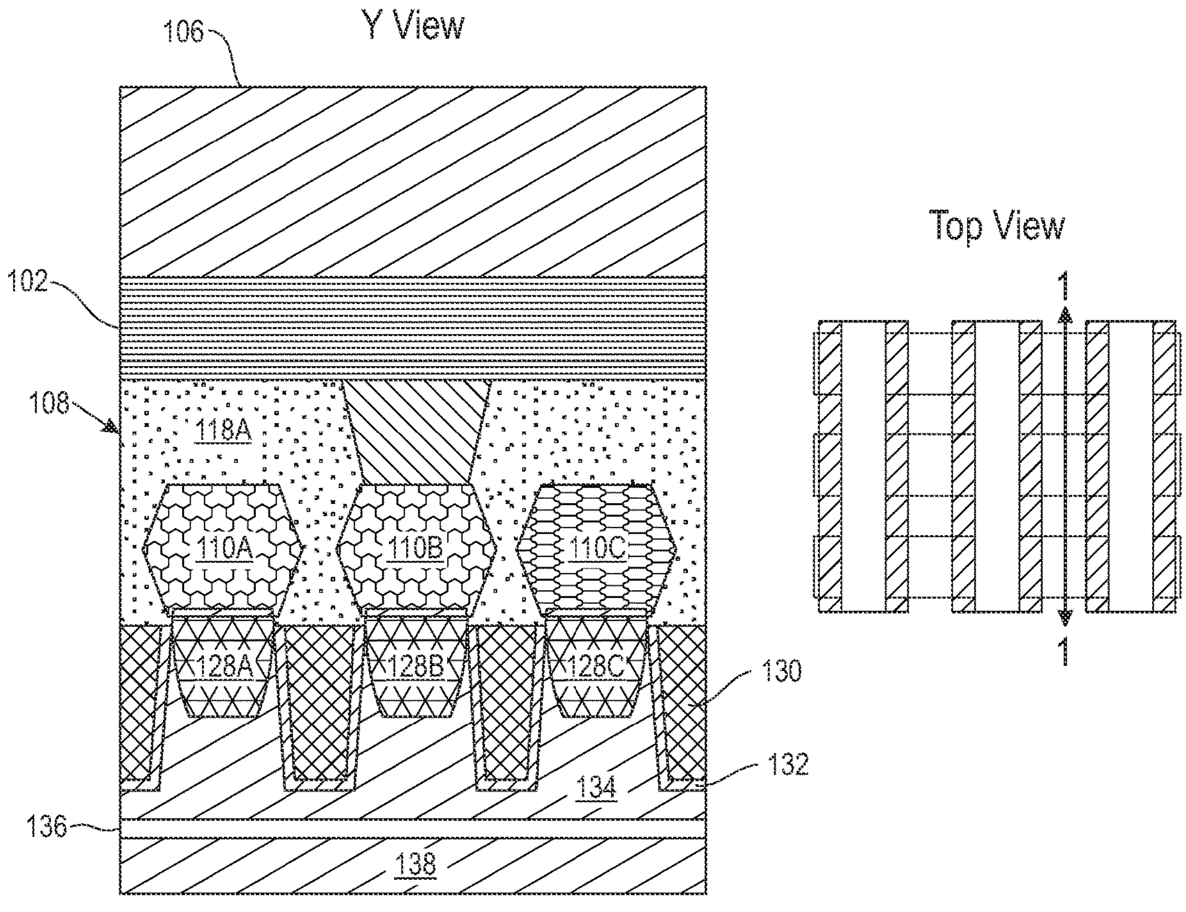
FIGS. 3A, 3B, 3C, 3D, 3E, 3F, 3G, 3H, 3I, 3J, and 3K are a series of cross-section views of stages in a manufacture of the semiconductor structure according to the method of FIG. 2, in accordance with an embodiment of the present disclosure.

FIG. 2 is a flowchart of method 200 of manufacturing semiconductor structure 100. FIGS. 3A-3K are a series of cross-section views of stages in a manufacture of semiconductor structure 100 according to method 200. The results of each operation in method 200 are illustrated in one of FIGS. 3A-3K, so FIGS. 2 and 3A-3K will be discussed in conjunction with one another. In addition, during this discussion, references may be made to features of semiconductor structure 100 (shown in FIG. 1), however, some features may be omitted for the sake of simplicity. FIG. 3A includes a top view and a Y view, and the orientation and location of the Y view is indicated by line 1-1 in the top view. This Y view orientation and location provides a frame of reference for FIG. 1 and FIGS. 3B-3K as well.

In the illustrated embodiment, method 200 begins at operation 202 wherein a top semiconductor structure assembly is partially formed. In particular, as shown in FIG. 3A, top interconnect 102; carrier wafer 106; a portion of insulating member 108 (i.e., insulator 118A), S/Ds 110, vias 116, placeholders 128A-128C (collectively "placeholders 128"), insulating material 130, insulating material 132, substrate 134, etch stop 136, and substrate 138 are formed. In some embodiments, placeholders 128 can exist underneath every S/D 110 regardless of whether an S/D will be connected to top interconnect 102 or bottom interconnect 104 (which can be known as a "placeholder everywhere" approach). In some embodiments, placeholders 128 are epitaxial components comprised of a different silicon-based material (e.g., one with a different germanium content) from that of carrier wafer 106, substrate 134, and/or substrate 138. In addition, the recesses for placeholders 128 can be dug in the same operation as the recesses for S/Ds 110, so placeholders 128 can be self-aligned with their respective S/Ds 110.

Figure 3B:
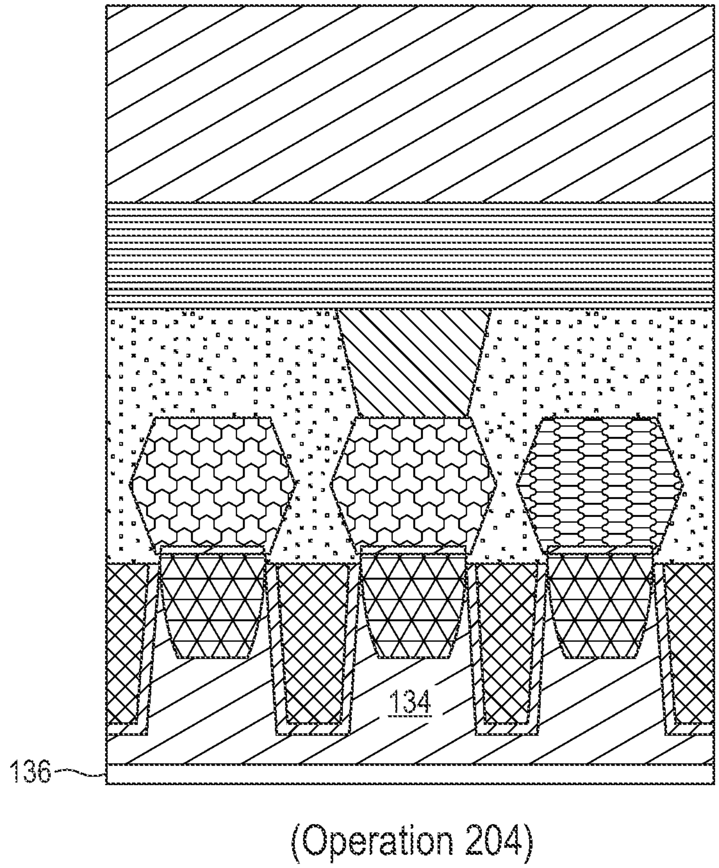
Figure 3C:
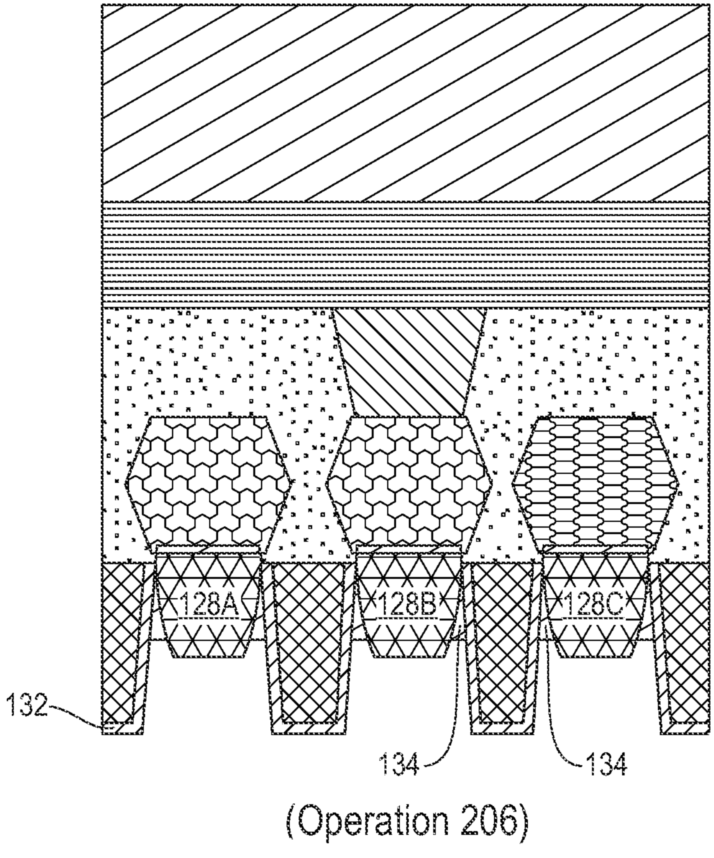
Figure 3D:
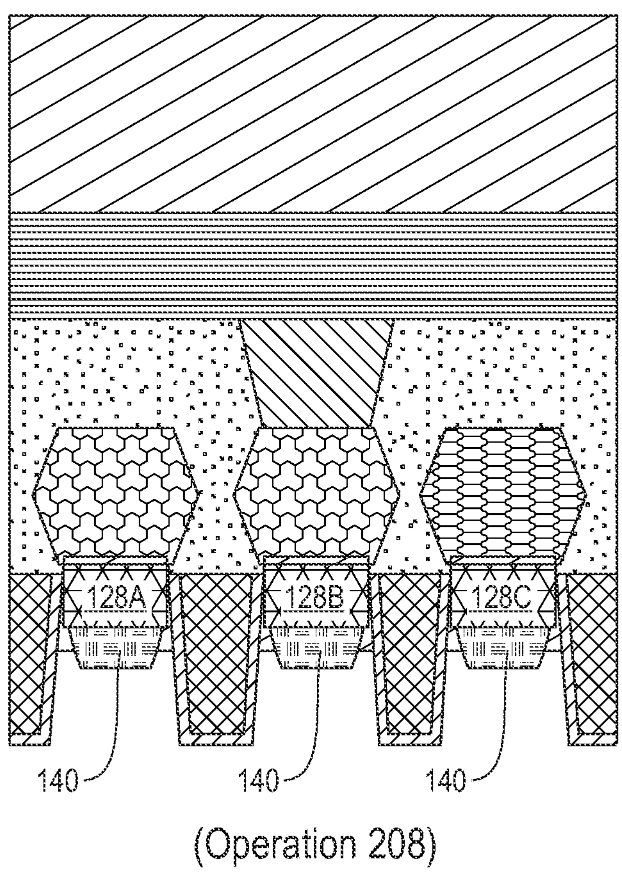
Figure 3E:
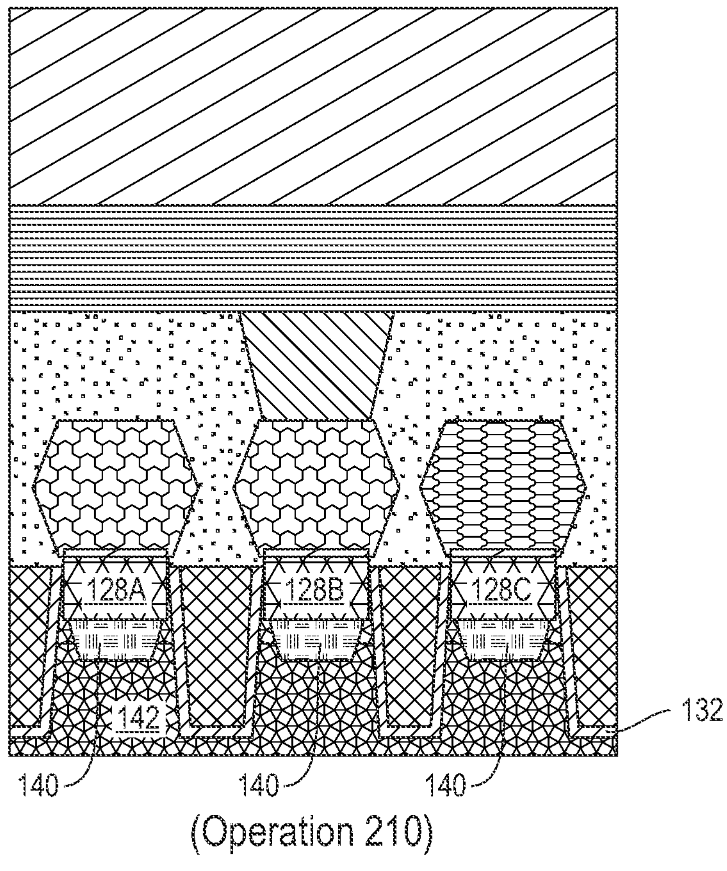

In the illustrated embodiment, at operation 204, the partially-formed assembly that has been made so far is flipped to provide access to its bottom side. (However, the orientation has not changed from FIG. 3A to FIG. 3B for visual continuity.) As shown in FIG. 3B, substrate 138 is removed to expose etch stop 136. At operation 206, etch stop 136 and most of substrate 134 are removed to expose placeholders 128 and insulating material 132, as shown in FIG. 3C. However, some of substrate 134 remains on the lateral sides of placeholders 128 and insulating material 132. At operation 208, placeholders 128 are recessed, and insulating material 140 is formed on placcholders 128. As shown in FIG. 3D, insulating material 140 forms dielectric caps (e.g., comprising silicon carbide or silicon carbon oxide, which have selectivity compared to, for example, nitride materials that comprise other insulators 118) on each of the remaining portions of placeholders 128. At operation 210, the remaining portion of substrate 134 is removed to expose portions of insulating material 132 and portions of placeholders 128. As shown in FIG. 3E, insulating material 142 is formed on placeholders 128, insulating material 132, and insulating material 140.

Figure 3F:
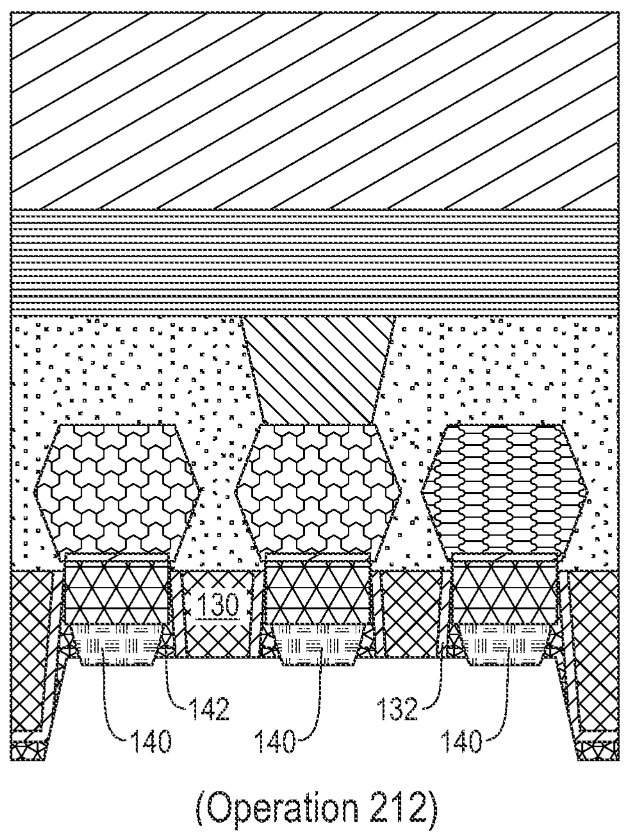
Figure 3G:
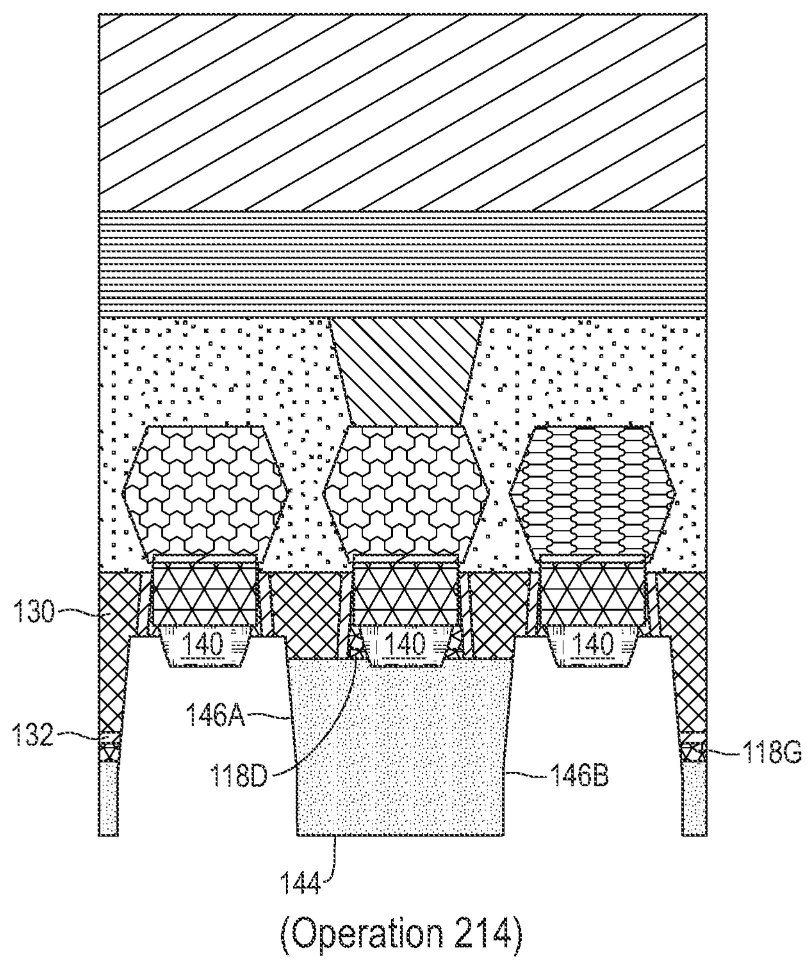
Figure 3H:
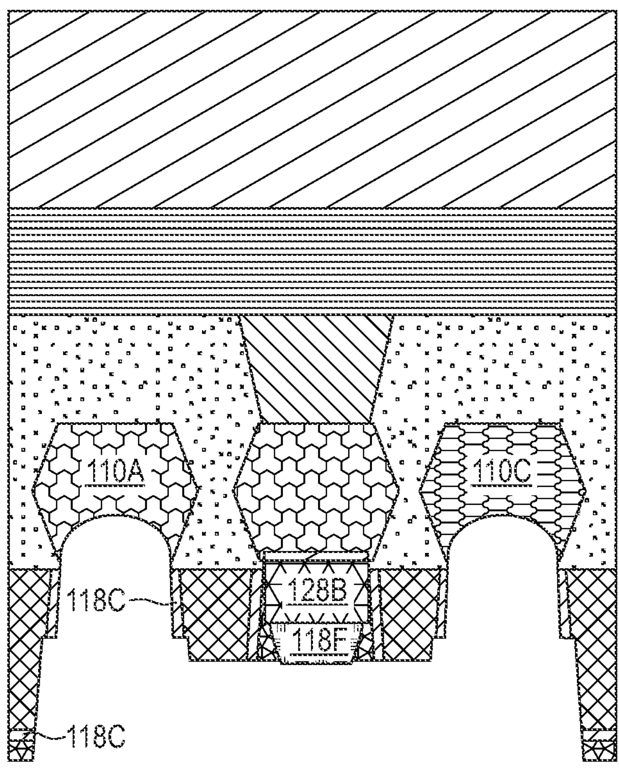

In the illustrated embodiment, at operation 212, a mask (not shown) is selectively applied to some areas, then some of insulating material 142 is removed to expose insulating material 130, insulating material 132, and insulating material 140. As shown in FIG. 3F, some insulating material 142 remains on the lateral sides of insulating material 132 and insulating material 140. At operation 214, mask 144 is selectively applied to the assembly thus far, and recesses 146A-146B (collectively "recesses 146") are formed by removing portions of insulating material 130, insulating material 132, and insulating material 140. As shown in FIG. 3G, mask 144 remains over the portions of insulating material 140 that will become insulator 118F. In addition, insulators 118D and 118G are finalized. As will be seen later in method 200, recesses 146 form some of the lateral edges of leads 112. At operation 216, mask 144, placeholders 128A and 128C, and some of insulating material 140 are removed to expose S/Ds 110A and 110C and to finalize insulator 118C. Insulator 118F is also finalized due to the removal of the other portions of insulating material 140. In some embodiments, S/Ds 110A and 110C are gouged into (as shown in FIG. 3H) at operation 216, although in other embodiments, S/Ds 110A and 110C are merely exposed without being gouged into.

Figure 3I:
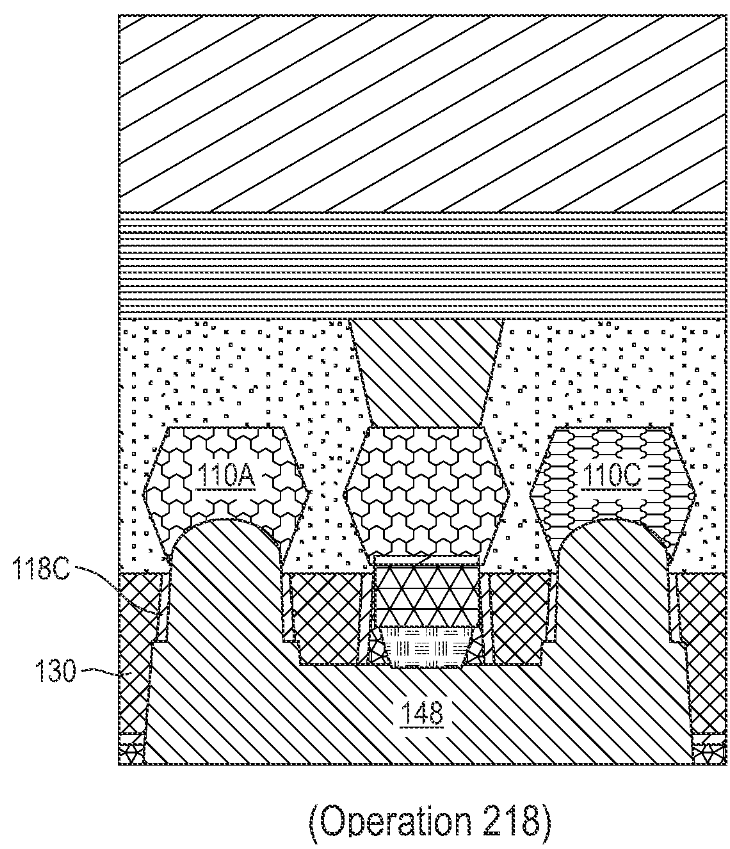
Figure 3J:
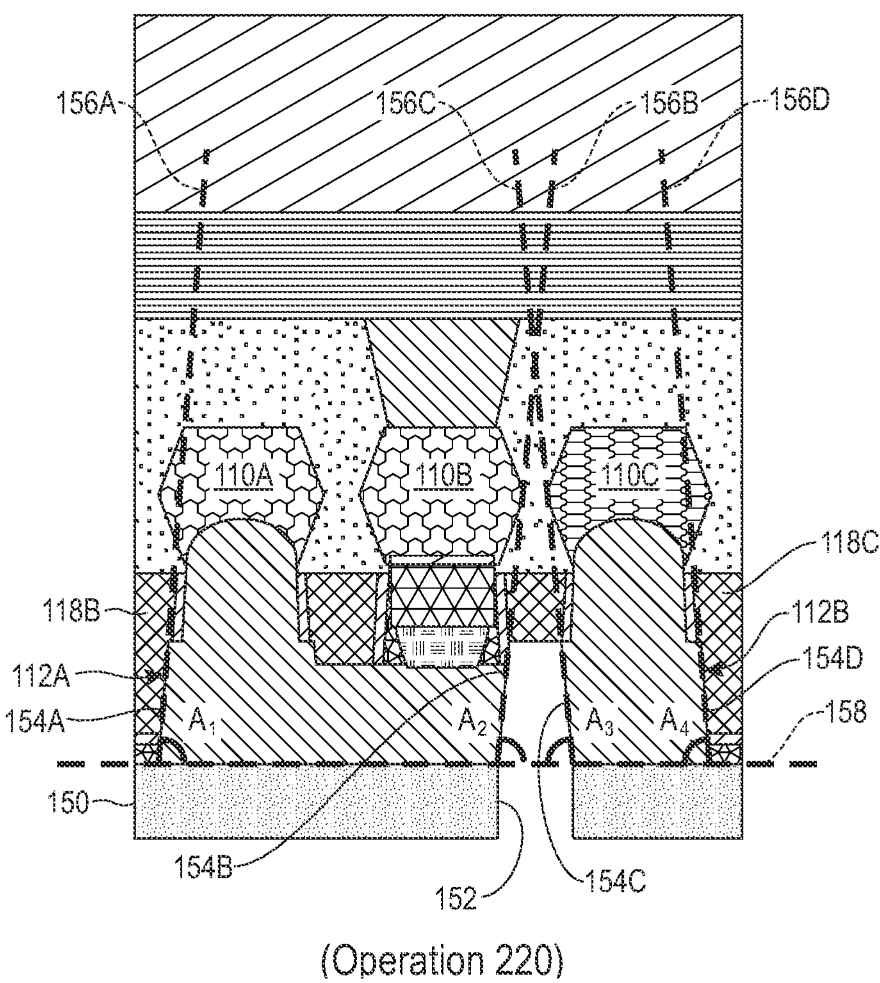

In the illustrated embodiment, at operation 218, conducting material 148 is formed on S/Ds 110A and 110C, insulator 118C, and insulating material 130. As shown in FIG. 3I, S/Ds 110A and 110C are electrically connected. At operation 220, mask 150 is selectively applied to the assembly thus far, and recess 152 is formed by removing portions of insulating material 130, insulating material 132, and conducting material 148. As shown in FIG. 3J, forming recess 152 severs conducting material 148 into two portions (i.e., one being lead 112A and the other being lead 112B) that are electrically isolated from each other.

In the illustrated embodiment, method 200 results in the lateral sides 154A-154D of leads 112A and 112B having angles $A_1$-$A_4$, respectively, which are indicated using sidelines 156A-156D, respectively, and baseline 158 (which extends in the lateral direction at the bottoms of lead 112). Lateral side 154A is angled acutely inwards towards S/D 110A, and sideline 156A intersects S/D 110A. Lateral side 154B is angled away from S/D 110A and is instead angled acutely inwards towards S/D 110C. Lateral side 154D is angled acutely inwards towards S/D 110C, and sideline 156D intersects S/D 110C. Lateral side 154C is angled away from S/D 110C and is instead angled acutely inwards towards S/D 110A. In addition, because angles A1 and A4 of the laterally outer sides of leads 112A and 112B were determined at operation 216, so angles $A_1$ and $A_4$ can have approximately the same acute value (e.g., within five degrees of one another) with opposite orientations. Similarly, because angles $A_2$ and $A_3$ of the laterally inner sides of leads 112A and 112B were determined at operation 220, angles $A_2$ and $A_3$ can have approximately the same acute angle value (e.g., within five degrees of one another) with opposite orientations. This also means that angles $A_1$ and $A_4$ can be different from that of $A_2$ and $A_3$ in some embodiments (e.g., at least one degree different from one another).

Figure 3K:
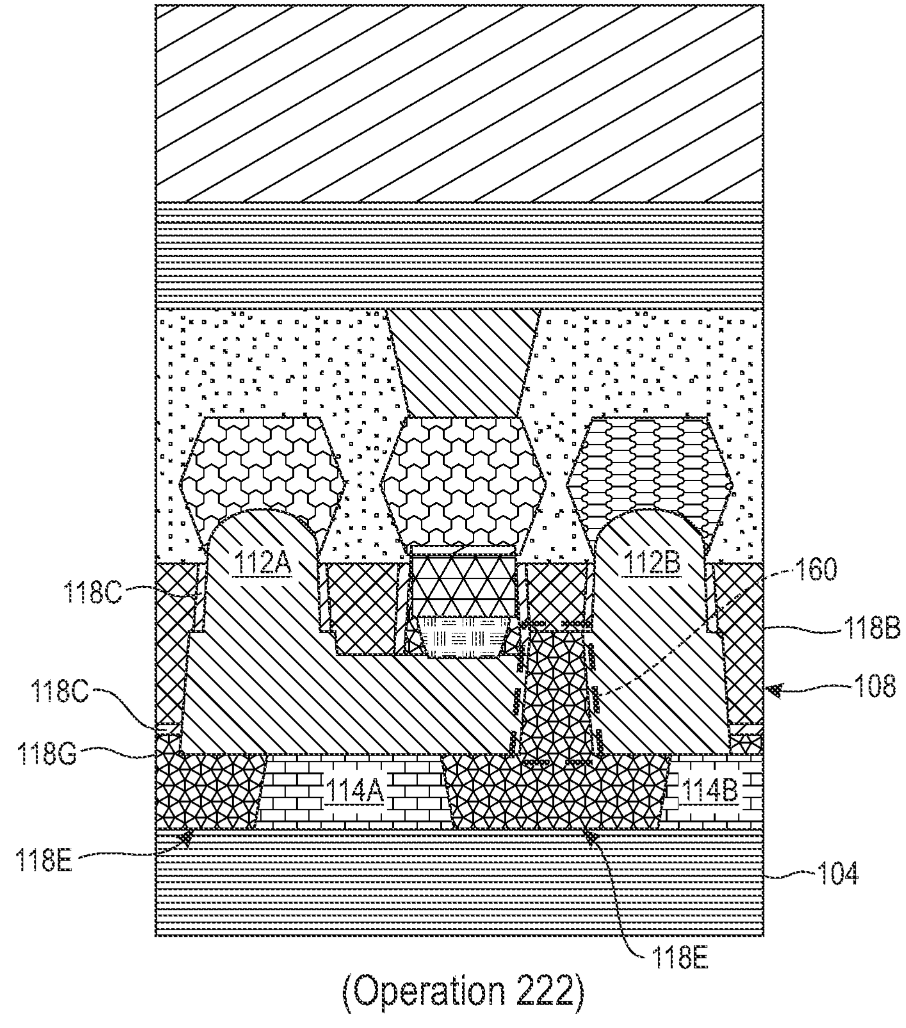

In the illustrated embodiment, also at operation 220, insulators 118B and 118C are finalized. At operation 222, rails 114 and insulator 118E are formed on insulators 118C, 118B, and 118G and leads 112, respectively, and bottom interconnect 104 is formed on rails 114 and insulator 118E. As shown in FIG. 3K, this finalizes insulating member 108, which includes plug 160. Plug 160 is a portion of insulator 118E that extends upwards between lead 112A and lead 112B to maintain their electrical isolation from each other despite leads 112 being initially a single, monolithic component.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process operations described herein can be incorporated into a more comprehensive procedure or process having additional operations or functionality not described in detail herein. In particular, various operations in the manufacture of semiconductor devices and semiconductor-based ICs are well known and so, in the interest of brevity, many conventional operations will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer operations are repeated multiple times. Each pattern being printed on the wafer is aligned to the previously formed patterns and gradually the conductors, insulators and selectively doped regions are built up to form the final device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising a first interconnect on one side and a second interconnect on an opposing side separated from the first interconnect by a longitudinal thickness of an insulating member that extends laterally along the first interconnect and the second interconnect, the semiconductor structure comprising:
- a first source/drain (S/D) positioned in the insulating member between the first interconnect and the second interconnect;
- a second S/D positioned in the insulating member adjacent to the first S/D; and
- a first lead electrically connected to the first S/D and to the second interconnect and electrically insulated from the second S/D, wherein,
  - a first lateral end of the first lead is angled inwards towards the first S/D at a first acute angle relative to a lateral direction; and
  - a second lateral end of the first lead is angled away from the first S/D at a second acute angle relative to the lateral direction.

2. The semiconductor structure of claim 1, wherein the first acute angle is different from the second acute angle.

3. The semiconductor structure of claim 1, wherein a portion of the first lead laps the first S/D and the second S/D laterally.

4. The semiconductor structure of claim 1, wherein the second S/D is electrically connected to the first interconnect.

5. The semiconductor structure of claim 1, further comprising an epitaxial placeholder in direct contact with the second S/D on a side of the second S/D that is closest to the first lead.

6. The semiconductor structure of claim 5, wherein the epitaxial placeholder is in contact with a dielectric cap.

7. The semiconductor structure of claim 6, wherein the dielectric cap is in contact with the first lead.

8. The semiconductor structure of claim 1, further comprising:
- a third S/D positioned in the insulating member adjacent to the second S/D on an opposite side from the first S/D; and
- a second lead electrically connected to the third S/D and to the second interconnect and electrically insulated from the second S/D and the first lead, wherein,
  - a third lateral end of the second lead is angled inwards towards the third S/D at a third acute angle relative to the lateral direction; and
  - a fourth lateral end of the second lead is angled away from the third S/D at a fourth acute angle relative to the lateral direction.

9. The semiconductor structure of claim 8, wherein the first acute angle and the second acute angle are oriented opposite to the third acute angle and the fourth acute angle.

10. The semiconductor structure of claim 1, wherein,
- the insulating member comprises a plurality of insulators; and
- an insulator of the plurality of insulators positioned between the first lead and the second lead to electrically insulate the first lead from the second lead.

11. A semiconductor structure comprising a first interconnect on one side and a second interconnect on an opposing side separated from the first interconnect by a longitudinal thickness of an insulating member that extends laterally along the first interconnect and the second interconnect, the semiconductor structure comprising:
- a first source/drain (S/D) positioned in the insulating member between the first interconnect and the second interconnect, wherein the insulating member comprises a plurality of insulators;
- a second S/D positioned in the insulating member adjacent to the first S/D;
- a third S/D positioned in the insulating member adjacent to the second S/D on the opposite side from the first S/D;
- a first lead electrically connected to the first S/D and to the second interconnect and electrically insulated from the second S/D;
- a second lead electrically connected to the third S/D and to the second interconnect and electrically insulated from the second S/D; and an insulator of the plurality of insulators positioned between the first lead and the second lead to electrically insulate the first lead from the second lead;

wherein, a first lateral end of the first lead is angled inwards towards the first S/D at a first acute angle relative to a lateral direction; and a second lateral end of the first lead is in contact with the insulator and is angled towards the third S/D at a second acute angle relative to the lateral direction.

12. The semiconductor structure of claim 11, wherein the first acute angle is different from the second acute angle.

13. The semiconductor structure of claim 11, wherein, a third lateral end of the second lead is angled inwards towards the third S/D at a third acute angle; and a fourth lateral end of the second lead is in contact with the insulator and is angled towards the second S/D at a fourth acute angle.

14. The semiconductor structure of claim 13, wherein the first acute angle and the fourth acute angle have approximately a same value and an opposite orientation.

15. The semiconductor structure of claim 13, wherein the second acute angle and the third acute angle have approximately a same value and an opposite orientation.

16. The semiconductor structure of claim 11, further comprising an epitaxial placeholder in direct contact with the second S/D on a side of the second S/D that is closest to the first lead, wherein:

the epitaxial placeholder is in contact with a dielectric cap; and the dielectric cap is in contact with the first lead.

17. The semiconductor structure of claim 11, wherein a portion of the first lead laps the first S/D and the second S/D laterally.

18. The semiconductor structure of claim 11, wherein the second S/D is electrically connected to the first interconnect.

19. The semiconductor structure of claim 11, wherein no portion of the second lead laps the second S/D laterally.

* * * * *